(12) United States Patent
Huang et al.

(10) Patent No.: US 9,154,086 B2
(45) Date of Patent: Oct. 6, 2015

(54) OPERATIONAL AMPLIFIER CIRCUIT AND METHOD IMPLEMENTING THE SAME

(71) Applicant: Fairchild Semiconductor Corporation, San Jose, CA (US)

(72) Inventors: Lei Huang, Beijing (CN); Hongtao Lv, Beijing (CN); Yanfang Li, Beijing (CN)

(73) Assignee: Fairchild Semiconductor Corporation, San Jose, CA (US)

( * ) Notice: Subject to any disclaimer, the term of this patent is extended or adjusted under 35 U.S.C. 154(b) by 53 days.

(21) Appl. No.: 14/052,244

(22) Filed: Oct. 11, 2013

(65) Prior Publication Data

US 2014/0104003 A1    Apr. 17, 2014

(30) Foreign Application Priority Data

Oct. 11, 2012    (CN) .......................... 2012 1 0390266

(51) Int. Cl.
*H03F 1/52*    (2006.01)
*H03F 3/45*    (2006.01)

(52) U.S. Cl.
CPC ............ *H03F 1/523* (2013.01); *H03F 3/45183* (2013.01); *H03F 2200/441* (2013.01)

(58) Field of Classification Search
CPC .............. H03F 1/30; H03F 1/303; H03F 1/52
USPC ............... 330/261, 297, 285, 296, 298, 207 P
See application file for complete search history.

(56) References Cited

U.S. PATENT DOCUMENTS

| | | | |
|---|---|---|---|
| 4,531,173 A * | 7/1985 | Yamada .......................... | 361/86 |
| 5,945,877 A | 8/1999 | Elango et al. | |
| 5,973,561 A | 10/1999 | Heaton | |
| 6,784,733 B1 | 8/2004 | Giacomini | |
| 6,995,605 B2 * | 2/2006 | Hazucha et al. ............... | 327/551 |
| 7,482,869 B2 * | 1/2009 | Wilson ........................... | 330/199 |
| 7,786,805 B2 * | 8/2010 | Trauth et al. ................... | 330/285 |
| 7,821,233 B2 * | 10/2010 | Nate et al. ...................... | 320/134 |
| 7,863,875 B1 | 1/2011 | Guo | |
| 8,665,021 B2 * | 3/2014 | Reisiger ........................ | 330/261 |
| 2013/0285730 A1 | 10/2013 | Huang et al. | |

* cited by examiner

*Primary Examiner* — Henry Choe
(74) *Attorney, Agent, or Firm* — Schwegman Lundberg & Woessner, P.A.

(57) ABSTRACT

The disclosure provides an operational amplifier circuit, in which a power supply of an amplifying circuit is coupled to a first voltage clamping circuit, and the first voltage clamping circuit clamps a supply voltage of the amplifying circuit when the supply voltage exceeds a normal-operation allowable voltage of the amplifying circuit. The disclosure also provides a method for implementing the operational amplifier circuit. According to the disclosure, the operational circuit may be avoided from subject to an excessive supply voltage, which may damage devices in the amplifying circuit of the operational amplifier.

29 Claims, 3 Drawing Sheets

US 9,154,086 B2

OPERATIONAL AMPLIFIER CIRCUIT AND METHOD IMPLEMENTING THE SAME

CROSS-REFERENCE TO RELATED APPLICATION

This application claims the benefit of priority to Chinese Patent Application Serial No. 201210390266.2, filed on Oct. 11, 2012, which is incorporated by reference herein in its entirety.

TECHNICAL FIELD

This document relates generally to operational amplification techniques and more particularly to an operational amplifier circuit and method for implementing the same.

BACKGROUND

An operational amplifier circuit is a circuit unit that can amplify a signal. Operational amplifier circuits are generally connected to one or more feedback networks to perform certain functions. The operational amplifier circuit can be implemented as either a discrete device or a semiconductor chip.

For normal operation of an operational amplifier circuit, a fixed supply voltage has to be supplied by a peripheral circuit. When failure of the peripheral circuit occurs, which causes the supply voltage to exceed a normal-operation voltage, the operational amplifier circuit cannot operate normally and internal devices may be damaged.

OVERVIEW

In view of the above, the disclosure provides, among other things, an operational amplifier circuit and method for implementing the same. In an embodiment, an operational amplifier circuit is provided, which includes a first voltage clamping circuit and an amplifying circuit. The first voltage clamping circuit is coupled to a power supply of the amplifying circuit and is configured to clamp a supply voltage of the amplifying circuit when the supply voltage exceeds a normal-operation allowable voltage of the amplifying circuit.

In another embodiment, a method for implementing the operational amplifier circuit is provided, in which a power supply of an amplifying circuit is coupled to a first voltage clamping circuit, and the first voltage clamping circuit clamps a supply voltage of the amplifying circuit when the supply voltage exceeds a normal-operation allowable voltage of the amplifying circuit.

According to the disclosure, a power supply of an amplifying circuit is coupled to a first voltage clamping circuit, and the first voltage clamping circuit clamps a supply voltage of the amplifying circuit when the supply voltage exceeds a normal-operation allowable voltage of the amplifying circuit. Accordingly, the operational amplifier circuit may be avoided from subject to an excessive supply voltage, and devices in the amplifying circuit of the operational amplifier circuit may be avoided from being damaged.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

According to various embodiments, a power supply of an amplifying circuit is coupled to a first voltage clamping circuit, and the first voltage clamping circuit clamps a supply voltage of the amplifying circuit when the supply voltage exceeds a normal-operation allowable voltage of the amplifying circuit.

The disclosure will be described in detail with reference to the drawings and the specific embodiments.

Figure 1:
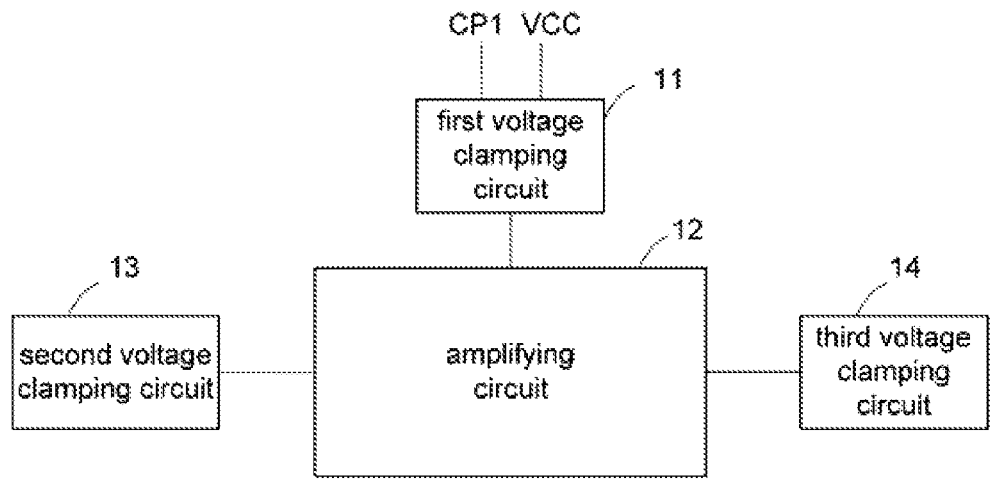
FIG. 1 is a diagram showing a structure of an operational amplifier circuit according to the disclosure.

The disclosure provides an operational amplifier circuit. As shown in FIG. 1, the operational amplifier circuit includes a first voltage clamping circuit 11 and an amplifying circuit 12.

The first voltage clamping circuit 11 is coupled to a power supply of the amplifying circuit 12 and is configured to clamp a supply voltage VCC of the amplifying circuit 12 when the supply voltage VCC exceeds a normal-operation allowable voltage of the amplifying circuit 12.

Specifically, the first voltage clamping circuit 11 is coupled to a first clamping control voltage CP1 and is configured to clamp the supply voltage VCC of the amplifying circuit 12 using the first clamping control voltage CP1 when the supply voltage VCC exceeds the normal-operation allowable voltage of the amplifying circuit 12.

Generally, the first clamping control voltage CP1 may be supplied by a peripheral circuit, and is equal to a maximum value of the normal-operation allowable supply voltage VCC of the amplifying circuit 12.

Figure 2:
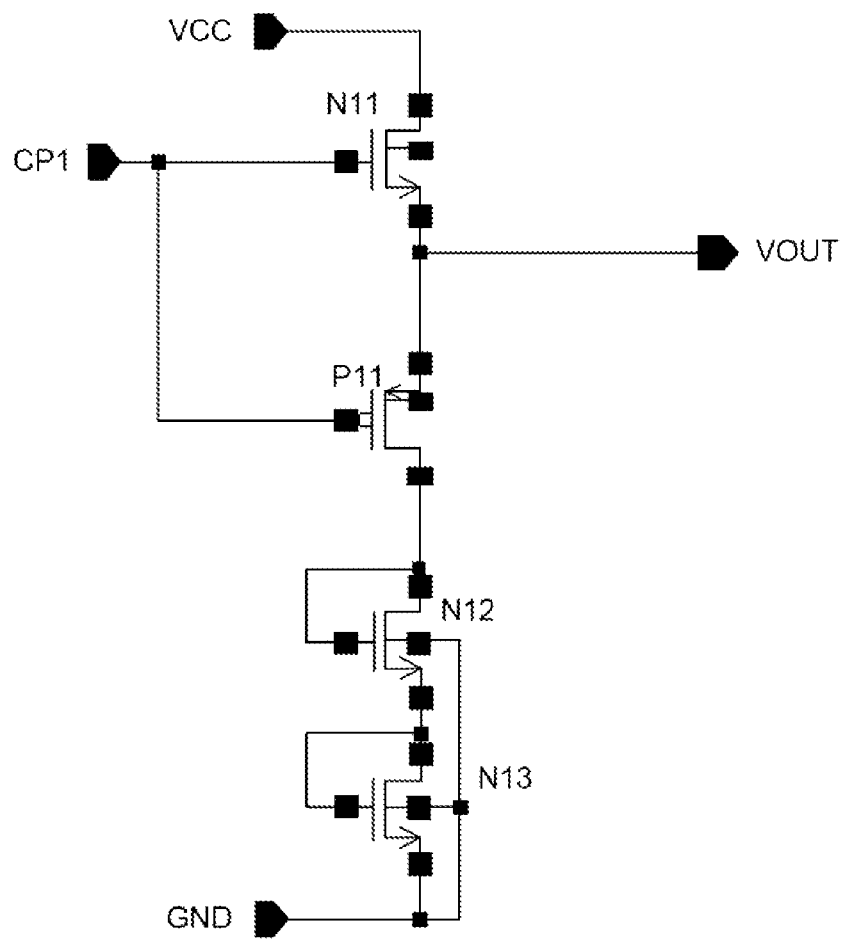
FIG. 2 is a diagram showing connection of a first voltage clamping circuit according to the disclosure.

As shown in FIG. 2, the first voltage clamping circuit 11 includes a first N-type metal oxide semiconductor field-effect transistor (NMOS) N11 and a first P-type metal oxide semiconductor field-effect transistor (PMOS) P11. The first NMOS N11 and the first PMOS P11 are coupled to each other in a cascode structure (e.g., they are coupled to have a common source and a common gate), both the first NMOS N11 and the first PMOS P11 are coupled to the first clamping control voltage CP1, sources of the first NMOS N11 and the first PMOS P11 are coupled to the power supply of the amplifying circuit 12 as an output VOUT, a drain of the first NMOS N11 is coupled to the supply voltage VCC, and a drain of the first PMOS P11 is coupled to ground GND as a ground terminal, or the drain of the first PMOS P11 is coupled to a second NMOS N12 and a third NMOS N13 in serial and then coupled to ground GND.

Generally, the first clamping control voltage CP1 may be supplied by a peripheral circuit, and is equal to a maximum value of the normal-operation supply voltage VCC of the amplifying circuit 12.

When the supply voltage VCC is equal to or less than the first clamping control voltage CP1, the first NMOS N11 is turned on, the first PMOS P11 is turned off and the supply voltage VCC is output at the output VOUT. When the supply voltage VCC is greater than the first clamping control voltage CP1, only one of the first NMOS N11 and the first PMOS P11 is turned on, the output voltage at the output VOUT is in a range from the first clamping control voltage CP1 minus a turn-on voltage Vthn of the first NMOS N11 to the first clamping control voltage CP1 plus a turn-on voltage Vthp of the first PMOS P11.

Additionally, the operational amplifier circuit may also include at least one second voltage clamping circuit 13 or a third voltage clamping circuit 14. Alternatively, the operational amplifier circuit may include both the second voltage clamping circuit(s) 13 and the third voltage clamping circuit 14.

The second voltage clamping circuit(s) 13 is coupled to an input of the amplifying circuit 12 and is configured to clamp an input voltage of the amplifying circuit 12 when the input voltage exceeds an allowable input voltage of the amplifying circuit 12.

Specifically, the second voltage clamping circuit(s) 13 is coupled to a second clamping control voltage and is configured to clamp the input voltage of the amplifying circuit 12 using the second clamping control voltage when the input voltage exceeds the allowable input voltage of the amplifying circuit 12. Generally, the second clamping control voltage may be supplied by a peripheral circuit, and is equal to a maximum value of the allowable input voltage of the amplifying circuit 12.

The third voltage clamping circuit 14 is coupled to an output of the amplifying circuit 12 and configured to clamp an output voltage of the amplifying circuit 12 when the output voltage exceeds an allowable output voltage of the amplifying circuit 12.

Specifically, the third voltage clamping circuit 14 is coupled to a third clamping control voltage and is configured to clamp the output voltage of the amplifying circuit 12 using the third clamping control voltage when the output voltage exceeds the allowable output voltage of the amplifying circuit 12. Generally, the third clamping control voltage may be supplied by a peripheral circuit, and is equal to a maximum value of the allowable output voltage of the amplifying circuit 12.

The structure of the second voltage clamping circuit 13 is as same as that of the first voltage clamping circuit 11, except that the second voltage clamping circuit 13 is coupled to the input voltage and the second clamping control voltage while the first voltage clamping circuit 11 is coupled to the supply voltage and the first clamping control voltage, and the output of the second voltage clamping circuit 13 is coupled to the input of the amplifying circuit 12.

The second clamping control voltage may be as same as or different from the first clamping control voltage, which may be configured according to the requirement of the specific circuit.

The structure of the third voltage clamping circuit 14 is as same as that of the first voltage clamping circuit 11, except that the third voltage clamping circuit 14 is coupled to the output voltage and the third clamping control voltage while the first voltage clamping circuit 11 is coupled to the supply voltage and the first clamping control voltage, and the output the third voltage clamping circuit 14 is coupled to the output of the amplifying circuit 12.

The third clamping control voltage may be as same as or different from the first clamping control voltage, which may be configured according to the requirement of the specific circuit.

The amplifying circuit 12 is a circuit unit having an amplifying function, and may be a common operational amplifying circuit, a high input-resistance differential amplifying circuit or a high voltage operational amplifying circuit. The amplifying circuit 12 may include an offset circuit for supplying an offset current. The offset circuit may include a current mirror circuit consisting of two or more NMOSs and a cascade circuit, each NMOS being a high-voltage NMOS.

Figure 3:
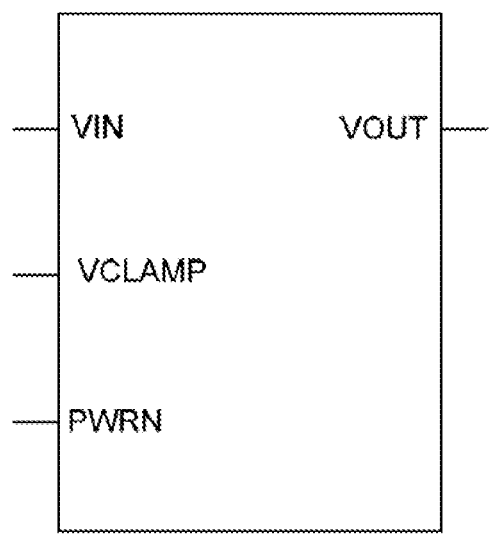
FIG. 3 is a diagram showing package of the first voltage clamping circuit according to the disclosure.

FIG. 3 is a diagram showing the package of the first voltage clamping circuit 11, the second voltage clamping circuit 13 or the third voltage clamping circuit 14. In the package, Pin VCLAMP for coupling to a clamping control voltage, Pin VIN for coupling to a voltage to be clamped, Pin PWRN for coupling to ground and Pin VOUT for output are included. Pin VCLAMP for coupling to the clamping control voltage may be coupled to one of the first clamping control voltage, the second clamping control voltage and the third clamping control voltage. Pin VIN for coupling to the voltage to be clamped may be coupled to a voltage to be clamped, such as the supply voltage VCC, the input voltage of the amplifying circuit 12 or the output voltage of the amplifying circuit 12.

Figure 4:
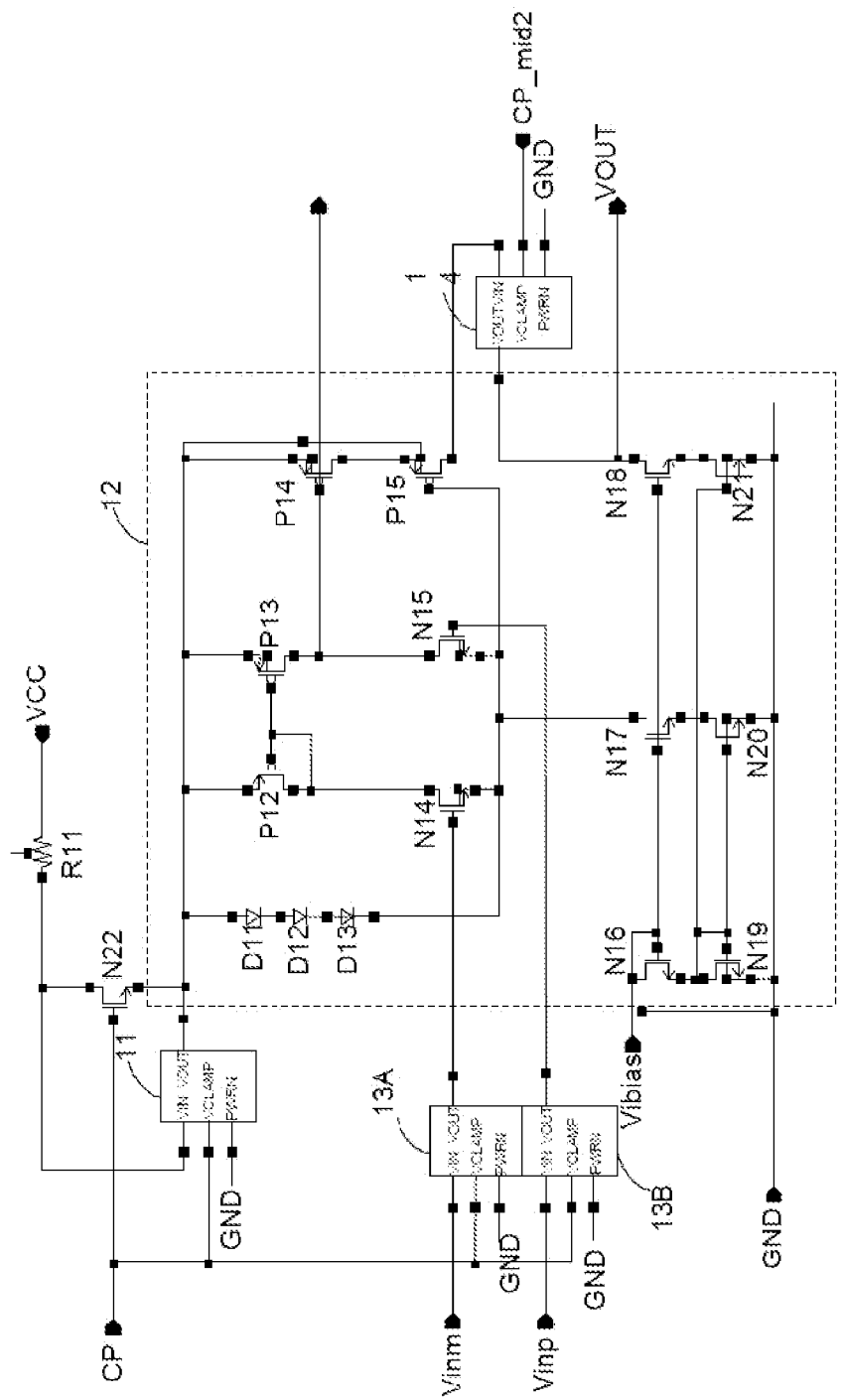
FIG. 4 is a diagram showing internal connection of an operational amplifier circuit according to the disclosure.

FIG. 4 shows an operational amplifier circuit according to the disclosure. The operational amplifier circuit consists of a first voltage clamping circuit 11, two second voltage clamping circuits 13A and 13B, a third voltage clamping circuit 14 and an amplifying circuit 12. The packages of the first voltage clamping circuit 11, the two second voltage clamping circuits 13A and 13B and the third voltage clamping circuit 14 may be as same as what is shown in FIG. 3. The first clamping control voltage coupled to the first voltage clamping circuit 11 may be as same as the second clamping control voltage coupled to the second voltage clamping circuit 13A and 13B, and both the first and second clamping control voltages are coupled to the voltage CP at Pin VCLAMP. In the first voltage clamping circuit 11, Pin VIN is coupled to the supply voltage VCC through a resistor R11, and Pin PWRN is coupled to ground GND. In the second voltage clamping circuits 13A and 13B, Pins VIN are respectively coupled to a positive input voltage Vinm and a negative input voltage Vinp for transferring to the amplifying circuit 12, Pins PWRN are coupled to ground GND, Pins VOUT are respectively coupled to a positive input and a negative input of the amplifying circuit 12. In the third voltage clamping circuit 14, Pin VIN is coupled to the output voltage of the amplifying circuit 12, Pin VCLAMP is coupled to the third clamping control voltage CP_mid2, Pin VOUT functions as the output of the amplifying circuit 12, and Pin PWRN is coupled to ground GND.

The amplifying circuit 12 may include a second PMOS P12, a third PMOS P13, a fourth PMOS P14, a fifth PMOS P15, a fourth NMOS N14, a fifth NMOS N15, a sixth NMOS N16, a seventh NMOS N17, an eighth NMOS N18, a ninth NMOS N19, a tenth NMOS N20 and an eleventh NMOS N21. The second PMOS P12, the third PMOS P13 and the fourth PMOS P14 are coupled as a current mirror circuit. Sources of the second PMOS P12, the third PMOS P13 and the fourth PMOS P14 are coupled to Pin VOUT of the first voltage clamping circuit 11. A drain of the second PMOS P12 is coupled to a drain of the fourth NMOS N14. A drain of the third PMOS P13 is coupled to a drain of the fifth NMOS N15. A drain of the fourth PMOS P14 is coupled to a source of the fifth PMOS P15. For the fourth NMOS N14, its gate functions as the positive input of the amplifying circuit 12 and is coupled to Pin VOUT of the second voltage clamping circuit 13A, its source is coupled to a source of the fifth NMOS N15, to a drain of the seventh NMOS N17 and a gate of the fifth PMOS P15. For the fifth NMOS N15, its gate functions as the negative input of the amplifying circuit 12 and is coupled to Pin VOUT of the second voltage clamping circuit 13B, its drain is coupled to Pin VIN of the third voltage clamping circuit 14. A drain and gate of the sixth NMOS N16, a gate of the seventh NMOS N17, and a gate of the eighth NMOS N18 are coupled to an offset voltage Vibias. A source of the sixth NMOS N16 is coupled to a drain and gate of the ninth NMOS N19 and a gate of the eleventh NMOS N21. A source of the seventh NMOS N17 is coupled to a drain of the tenth NMOS N20. A source of the eighth NMOS N18 is coupled to a drain of the eleventh NMOS N21. A drain of the eighth NMOS N18 is coupled to Pin VOUT of the third voltage clamping circuit 14. The ninth NMOS N19, the tenth NMOS N20 and the eleventh NMOS N21 are coupled as a cascade circuit. The sixth NMOS N16, the seventh NMOS N17, the eighth NMOS N18, the ninth NMOS N19, the tenth NMOS N20 and the eleventh NMOS N21 constitute an offset circuit. The sixth NMOS N16, the seventh NMOS N17, and the eighth NMOS N18 constitute a current mirror circuit of the offset circuit, all of them being high voltage NMOSs.

The amplifying circuit 12 may also include a first diode D11, a second diode D12 and a third diode D13. The first diode D11, the second diode D12 and the third diode D13 are coupled in serial between the source of the second PMOS P12 and the source of the fourth NMOS N14.

The operational amplifier circuit may also include a twelfth NMOS N22, of which a gate is coupled to voltage CP, a drain is coupled to Pin VIN of the first voltage clamping circuit 11 and a source is coupled to Pin VOUT of the first voltage clamping circuit 11. The twelfth NMOS N22 may be a high voltage NMOS.

In the operational amplifier circuit as shown in FIG. 4, when the supply voltage VCC is greater than the voltage CP, the first voltage clamping circuit 11 clamps the supply voltage VCC to be approximately at the voltage CP, and outputs the clamped voltage to the amplifying circuit 12; when the positive input voltage Vinm is greater than the voltage CP, the second voltage clamping circuit 13A clamps the positive input voltage Vinm to be approximately at the voltage CP, and outputs the clamped voltage to the amplifying circuit 12; when the negative input voltage Vinp is greater than the voltage CP, the second voltage clamping circuit 13B clamps the negative input voltage Vinp to be approximately at the voltage CP, and output the clamped voltage to the amplifying circuit 12; and when the output voltage of the amplifying circuit 12 is greater than the voltage CP, the third voltage clamping circuit 14 clamps the output voltage of the amplifying circuit 12 to be approximately at the voltage CP for output.

The disclosure also provides a method for implementing the operational amplifier circuit. In the method, a power supply of an amplifying circuit is coupled to a first voltage clamping circuit, and the first voltage clamping circuit clamps a supply voltage of the amplifying circuit when the supply voltage exceeds a normal-operation allowable voltage of the amplifying circuit.

Specifically, the first voltage clamping circuit clamps the supply voltage by coupling the first voltage clamping circuit to a first clamping control voltage and clamping the supply voltage using the first clamping control voltage.

The first voltage clamping circuit may include a first NMOS and a first PMOS coupled in a cascode structure, gates of the first NMOS and the first PMOS are coupled to the first clamping control voltage, sources of the first NMOS and the first PMOS are coupled to an output and a drain of the first NMOS is coupled to a supply voltage. When the supply voltage is equal to or less than the first clamping control voltage, the first NMOS is turned on, the first PMOS is turned off and the supply voltage is output. When the supply voltage is greater than the first clamping control voltage, only one of the first NMOS and the first PMOS is turned on, the output voltage is in a range from the first clamping control voltage minus a turn-on voltage of the first NMOS to the first clamping control voltage plus a turn-on voltage of the first PMOS.

Generally, the first clamping control voltage may be supplied by a peripheral circuit, and is equal to a maximum value of the normal-operation supply voltage of the amplifying circuit.

Additionally, the second voltage clamping voltage may be coupled to the input of the amplifying circuit, and the second voltage clamping circuit may clamp the input voltage of the amplifying circuit when the input voltage exceeds the allowable input voltage of the amplifying circuit.

Alternatively, the third voltage clamping voltage may be coupled to the output of the amplifying circuit and the third voltage clamping circuit may clamp the output voltage of the amplifying circuit when the output voltage exceeds an allowable output voltage of the amplifying circuit.

Specifically, the second voltage clamping circuit clamps the input voltage by coupling the second voltage clamping circuit to a second clamping control voltage and clamping the input voltage using the second clamping control voltage.

Specifically, the third voltage clamping circuit clamps the output voltage by coupling the third voltage clamping circuit to a third clamping control voltage and clamping the output voltage using the third clamping control voltage.

In view of the above, the operational amplifier circuit according to the disclosure prevents supply voltage, input voltage and output voltage of the operational amplifier from being too high by using clamping circuits, and thus normal operation of the operational amplifier circuit can be guaranteed. The clamping circuit is simple in structure and is flexible in configuration, and thus is easy to be integrated into the operational amplifier circuit.

Additional Notes and Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system comprising:
a first voltage clamping circuit; and
an amplifying circuit,
wherein the first voltage clamping circuit is coupled to a power supply of the amplifying circuit, and is configured to clamp a supply voltage of the amplifying circuit when the supply voltage exceeds a normal-operation allowable voltage of the amplifying circuit, and
wherein the first voltage clamping circuit comprises a first N-type metal oxide semiconductor field-effect transistor (NMOS) and a first P-type metal oxide semiconductor field-effect transistor (PMOS) coupled in a cascode structure.

2. The system of claim 1,
wherein the first voltage clamping circuit is coupled to a first clamping control voltage and is configured to clamp the supply voltage of the amplifying circuit using the first clamping control voltage when the supply voltage exceeds the normal-operation allowable voltage of the amplifying circuit.

3. The system of claim 2,
wherein gates of both the first NMOS and the first PMOS are coupled to the first clamping control voltage, sources of the first NMOS and the first PMOS are coupled to the power supply of the amplifying circuit as an output, a drain of the first NMOS is coupled to the supply voltage, and a drain of the first PMOS is coupled to a second NMOS and a third NMOS in serial and then coupled to ground.

4. The system of claim 1, comprising:
a second voltage clamping circuit coupled to an input of the amplifying circuit and configured to clamp an input voltage of the amplifying circuit when the input voltage exceeds an allowable input voltage of the amplifying circuit.

5. The system of claim 4,
wherein the second voltage clamping circuit is coupled to a second clamping control voltage and is configured to clamp the input voltage of the amplifying circuit using the second clamping control voltage when the input voltage exceeds the allowable input voltage of the amplifying circuit.

6. The system of claim 4, comprising:
a third voltage clamping circuit, coupled to an output of the amplifying circuit and configured to clamp an output voltage of the amplifying circuit when the output voltage exceeds an allowable output voltage of the amplifying circuit.

7. The system of claim 6,
wherein the third voltage clamping circuit is coupled to a third clamping control voltage, and is configured to clamp the output voltage of the amplifying circuit using the third clamping control voltage when the output voltage exceeds the allowable output voltage of the amplifying circuit.

8. The system of claim 1,
wherein the amplifying circuit comprises an offset circuit providing an offset current, and
wherein the offset circuit comprises a current mirror circuit consisting of two or more NMOSs and a cascade circuit, each NMOS being a high-voltage NMOS.

9. A method for implementing an operational amplifier circuit, comprising:
clamping a supply voltage of an amplifying circuit using a first voltage clamping circuit when the supply voltage exceeds a normal-operation allowable voltage of the amplifying circuit,
wherein the first voltage clamping circuit comprises a first N-type metal oxide semiconductor field-effect transistor (NMOS) and a first P-type metal oxide semiconductor field-effect transistor (PMOS) coupled in a cascode structure.

10. The method of claim 9,
wherein the clamping the supply voltage comprises;
using a first clamping control voltage.

11. The method of claim 10,
wherein gates of the first NMOS and the first PMOS are coupled to the first clamping control voltage, sources of the first NMOS and the first PMOS are coupled to an output and a drain of the first NMOS is coupled to a supply voltage, wherein when the supply voltage is equal to or less than the first clamping control voltage, the first NMOS is turned on, the first PMOS is turned off and the supply voltage is output, and wherein when the supply voltage is greater than the first clamping control voltage, only one of the first NMOS and the first PMOS is turned on, the output voltage is in a range from the first clamping control voltage minus a turn-on voltage of the first NMOS to the first clamping control voltage plus a turn-on voltage of the first PMOS.

12. The method of claim 9, comprising:
clamping an input voltage of the amplifying circuit using a second voltage clamping circuit when the input voltage exceeds an allowable input voltage of the amplifying circuit.

13. The method of claim 12, comprising:
clamping an output voltage of the amplifying circuit using a third voltage clamping circuit when the output voltage exceeds an allowable output voltage of the amplifying circuit.

14. The operational amplifier circuit of claim 2,
wherein gates of both the first NMOS and the first PMOS are coupled to the first clamping control voltage, sources of the first NMOS and the first PMOS are coupled to the power supply of the amplifying circuit as an output, a drain of the first NMOS is coupled to the supply voltage, and a drain of the first PMOS is coupled to ground as a ground terminal.

15. A system comprising:
an amplifying circuit;
a first voltage clamping circuit coupled to a power supply of the amplifying circuit and configured to clamp a supply voltage of the amplifying circuit when the supply voltage exceeds a normal-operation allowable voltage of the amplifying circuit;
a second voltage clamping circuit coupled to an input of the amplifying circuit and configured to clamp an input voltage of the amplifying circuit when the input voltage exceeds an allowable input voltage of the amplifying circuit; and
a third voltage clamping circuit coupled to an output of the amplifying circuit and configured to clamp an output voltage of the amplifying circuit when the output voltage exceeds an allowable output voltage of the amplifying circuit.

16. The system of claim 15,
wherein the first voltage clamping circuit comprises a first N-type metal oxide semiconductor field-effect transistor (NMOS) and a first P-type metal oxide semiconductor field-effect transistor (PMOS) coupled in a cascode structure.

17. The system of claim 16,
wherein gates of both the first NMOS and the first PMOS are coupled to the first clamping control voltage, sources of the first NMOS and the first PMOS are coupled to the power supply of the amplifying circuit as an output, a drain of the first NMOS is coupled to the supply voltage, and a drain of the first PMOS is coupled to a second NMOS and a third NMOS in serial and then coupled to ground.

18. The system of claim 16,
wherein gates of both the first NMOS and the first PMOS are coupled to the first clamping control voltage, sources of the first NMOS and the first PMOS are coupled to the power supply of the amplifying circuit as an output, a drain of the first NMOS is coupled to the supply voltage, and a drain of the first PMOS is coupled to ground as a ground terminal.

19. The system of claim 15,
wherein the amplifying circuit comprises an offset circuit providing an offset current, and
wherein the offset circuit comprises a current mirror circuit consisting of two or more NMOSs and a cascade circuit, each NMOS being a high-voltage NMOS.

20. A method for implementing an operational amplifier circuit, comprising:
clamping a supply voltage of an amplifying circuit using a first voltage clamping circuit when the supply voltage exceeds a normal-operation allowable voltage of the amplifying circuit;
clamping an input voltage of the amplifying circuit using a second voltage clamping circuit when the input voltage exceeds an allowable input voltage of the amplifying circuit; and
clamping an output voltage of the amplifying circuit using a third voltage clamping circuit when the output voltage exceeds an allowable output voltage of the amplifying circuit.

21. The method of claim 20, wherein the first voltage clamping circuit comprises a first N-type metal oxide semiconductor field-effect transistor (NMOS) and a first P-type metal oxide semiconductor field-effect transistor (PMOS) coupled in a cascode structure.

22. The method of claim 21,
wherein gates of both the first NMOS and the first PMOS are coupled to the first clamping control voltage, sources of the first NMOS and the first PMOS are coupled to the power supply of the amplifying circuit as an output, a drain of the first NMOS is coupled to the supply voltage, and a drain of the first PMOS is coupled to a second NMOS and a third NMOS in serial and then coupled to ground.

23. The method of claim 21,
wherein gates of both the first NMOS and the first PMOS are coupled to the first clamping control voltage, sources of the first NMOS and the first PMOS are coupled to the power supply of the amplifying circuit as an output, a drain of the first NMOS is coupled to the supply voltage, and a drain of the first PMOS is coupled to ground as a ground terminal.

24. The method of claim 20, comprising:
providing an offset current using an offset circuit, and
wherein the offset circuit comprises a current mirror circuit consisting of two or more NMOSs and a cascade circuit, each NMOS being a high-voltage NMOS.

25. A system comprising:
an amplifying circuit; and
a first voltage clamping circuit coupled to a power supply of the amplifying circuit and configured to clamp a supply voltage of the amplifying circuit when the supply voltage exceeds a normal-operation allowable voltage of the amplifying circuit,
wherein the amplifying circuit comprises an offset circuit configured to provide an offset current, and
wherein the offset circuit comprises a current mirror circuit consisting of two or more high-voltage N-type metal oxide semiconductor field-effect transistors (NMOSs) and a cascade circuit.

26. The system of claim 25, comprising:
a second voltage clamping circuit coupled to an input of the amplifying circuit and configured to clamp an input voltage of the amplifying circuit when the input voltage exceeds an allowable input voltage of the amplifying circuit; and a third voltage clamping circuit coupled to an output of the amplifying circuit and configured to clamp an output voltage of the amplifying circuit when the output voltage exceeds an allowable output voltage of the amplifying circuit.

27. The system of claim 25, wherein the first voltage clamping circuit comprises a first N-type metal oxide semiconductor field-effect transistor (NMOS) and a first P-type metal oxide semiconductor field-effect transistor (PMOS) coupled in a cascode structure.

28. The system of claim 27,
wherein gates of both the first NMOS and the first PMOS are coupled to the first clamping control voltage, sources of the first NMOS and the first PMOS are coupled to the power supply of the amplifying circuit as an output, a drain of the first NMOS is coupled to the supply voltage, and a drain of the first PMOS is coupled to a second NMOS and a third NMOS in serial and then coupled to ground.

29. The system of claim 27,
wherein gates of both the first NMOS and the first PMOS are coupled to the first clamping control voltage, sources of the first NMOS and the first PMOS are coupled to the power supply of the amplifying circuit as an output, a drain of the first NMOS is coupled to the supply voltage, and a drain of the first PMOS is coupled to ground as a ground terminal.

* * * * *